(12) United States Patent
Liero et al.

(10) Patent No.: US 10,802,116 B2
(45) Date of Patent: Oct. 13, 2020

(54) OPTICAL PULSE GENERATOR AND METHOD FOR OPERATING AN OPTICAL PULSE GENERATOR

(71) Applicant: FORSCHUNGSVERBUND BERLIN E.V., Berlin (DE)

(72) Inventors: Armin Liero, Berlin (DE); Andreas Klehr, Berlin (DE); Thomas Hoffmann, Berlin (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 0 days.

(21) Appl. No.: 16/338,405

(22) PCT Filed: Sep. 15, 2017

(86) PCT No.: PCT/EP2017/073232
§ 371 (c)(1),
(2) Date: Mar. 29, 2019

(87) PCT Pub. No.: WO2018/059965
PCT Pub. Date: Apr. 5, 2018

(65) Prior Publication Data
US 2020/0033446 A1 Jan. 30, 2020

(30) Foreign Application Priority Data
Sep. 30, 2016 (DE) .................. 10 2016 118 580

(51) Int. Cl.
*G01S 7/484* (2006.01)
*H01S 5/022* (2006.01)
*H01S 5/042* (2006.01)

(52) U.S. Cl.
CPC .......... *G01S 7/484* (2013.01); *H01S 5/02236* (2013.01); *H01S 5/02264* (2013.01); *H01S 5/0428* (2013.01)

(58) Field of Classification Search
CPC ............ H01S 5/02236; H01S 5/02264; H01S 5/0226; H01S 5/0428; G01S 7/484
See application file for complete search history.

(56) References Cited

U.S. PATENT DOCUMENTS 7,969,588 B2 6/2011 Iwata et al.
2011/0026878 A1 2/2011 Matsuoka et al.
(Continued)

FOREIGN PATENT DOCUMENTS

CN 102610998 B 4/2013
CN 105699709 A 6/2016
(Continued)

OTHER PUBLICATIONS

International Search Report mailed in PCT/EP2017/073232 dated Dec. 12, 2017.

*Primary Examiner* — Armando Rodriguez
(74) *Attorney, Agent, or Firm* — Fox Rothschild LLP

(57) ABSTRACT

The invention relates to an optical pulse generator comprising an active optical component adapted to emit optical radiation and electronic components of a means for electronically driving the optical component to excite the optical component to a pulsed emission of optical radiation, wherein the electronic components are arranged on a first side of a first submount, contact surfaces of the means for electronically driving are arranged on an opposite second side of the first submount, and the electronic components are connected to the contact surfaces of the means for electronically driving using electrically conductive vias in the first submount.

8 Claims, 1 Drawing Sheet

(56) References Cited

U.S. PATENT DOCUMENTS

| | | |
|---|---|---|
| 2012/0014639 A1 | 1/2012 | Doany et al. |
| 2014/0029639 A1 | 1/2014 | Zarbock et al. |
| 2015/0229912 A1* | 8/2015 | Masalkar ................ G01S 7/481 |
| | | 348/46 |

FOREIGN PATENT DOCUMENTS

| | | |
|---|---|---|
| EP | 2963445 A2 | 1/2016 |
| JP | S6367792 A | 3/1988 |
| JP | H06334169 A | 12/1994 |

* cited by examiner

OPTICAL PULSE GENERATOR AND METHOD FOR OPERATING AN OPTICAL PULSE GENERATOR

CROSS REFERENCE TO RELATED APPLICATIONS

This U.S. Application is a National Phase Entry of PCT/EP2017/073232 filed on Sep. 15, 2017, entitled "Optical Pulse Generator And Method For Operating An Optical Pulse Generator", which claims priority to German Application No. 10 2016 118 580.9 filed on Sep. 30, 2016, the entireties of which are hereby incorporated herein by reference.

This invention concerns an optical pulse generator and a method for operating an optical pulse generator. In particular, this invention concerns an optical pulse generator for high frequency (HF) pulse width modulation in LiDAR systems.

PRIOR ART

LiDAR (light detection and ranging) is a method for optical distance and speed measurement with laser beams. LiDAR systems are also increasingly being used in motor vehicles, in particular to detect obstacles. Corresponding LiDAR systems for use in motor vehicles, for example, are known from U.S. Pat. No. 7,969,588 B2.

In general, however, such systems operate with a fixed pulse width, so that reliable measurements can only be made with a limited number of independently operating systems. If the signals of a multitude of systems are superimposed, for example in dense city traffic with a multitude of reflecting obstacles, reliable detections are no longer possible. The increasing use of LiDAR therefore increases the risk of correspondingly serious misinterpretations. An autocorrelation of the transmitted and received signals to improve signal recognition, which is common in related radar systems, is only possible with considerable technological effort in the optical field.

One way of uniquely identifying the individual LiDAR signals is to imprint an individual signature using pulse width modulation. However, such modulation can only be achieved with a very fast logic circuit and a very low-induction design to achieve the necessary switching times.

Laser diodes and other semiconductor-based optical components emitting radiation (e.g. luminescence diodes, optical amplifier elements) generally do not yet have the appropriate electronics for fast pulsed control. Individual chips are separated by a manufacturing wafer and usually controlled via an external electronic circuit.

The laser diodes are often connected via a large number of individual bonding wires, which form a conductive connection between contact surfaces on the surface of the laser diode and corresponding contact surfaces of the electronic circuit. In order to achieve a uniform current density within the active layer, especially with high-power laser diodes, a large number of bond wires with a small cross-section are usually distributed as uniformly as possible over the entire laser length. Due to the small cross-section of the bond wires and the large area spanned by the current, such connections exhibit inductivities that are too high for the planned application. By using ribbons for contacting, the inductances that occur can be reduced, but they are still much too high, especially for fast HF pulse width modulation of the emitted radiation. Typical inductivities for wire bonding are 0.8-1.0 nH/mm bond wire length.

DISCLOSURE OF THE INVENTION

It is therefore a task of the present invention to specify an optical pulse generator and a method for operating an optical pulse generator which overcome the described disadvantages of the prior art. In particular, an optical pulse generator according to the invention shall enable HF pulse width modulation in LiDAR systems.

These tasks are solved according to the invention by the features of patent claim 1. Appropriate forms of the invention are contained in the dependent claims.

An optical pulse generator according to the invention comprises an active optical component adapted to emit optical radiation, wherein the optical component has contact surfaces for electrical contacting; means for electronically driving said optical device adapted to excite said optical device to pulsed emission of optical radiation, wherein the means for electronically driving has contact surfaces for electrical contacting; a first submount, wherein the means for electronically driving is arranged on the first submount; a second submount, wherein the optical component is arranged on the second submount. The optical pulse generator according to the invention is characterized in that the optical component is arranged between the first submount and the second submount, wherein at least one contact surface of the means for electronically driving is connected directly or by means of a solder point to at least one contact surface of the optical component.

Preferably an active optical component is a laser diode, a luminescence diode or an optical amplifier element. The optical component can have several contact surfaces for electrical contacting. Electrically conductive surface elements intended for contacting are preferably used as contact surfaces on the surface of an optical component. The contact surfaces can be formed on a single or on different surfaces of the optical component.

Preferably, the means for electronically driving of the optical component is a driver circuit for high-frequency pulse generation adapted to the electronic parameters of the active optical component. The means for electronically driving is preferably designed to drive the optical component via high-frequency high-current pulses. In particular, the means for electronically driving can generate the high current pulses in relation to the centre position of the optical component on one or both sides. The driver circuit can be composed of one or more pairs of control transistors and storage capacitors. The contact surfaces for contacting the means for electronically driving preferably consist of an electrically conductive material (e.g. metal). In addition to the electronic components mentioned above and the contact surfaces, the means for electronically driving may also include other electronic components, conductor paths and connecting elements.

The first submount can preferably be a special, flexible printed circuit board material or LTCC (ceramic). The means for electronically driving can be permanently connected to the first submount. An example of such a means for electronically driving ("circuit") permanently connected to a submount is a fully assembled and wired circuit board.

The second submount can preferably be a heat sink. The optical component can be fixed or detachably fixed (e.g. glued with a detachable adhesive) to the heat sink. Preferably it is a metallic heat sink with a large surface area. It is also preferred that the second submount consists of an electrically conductive material. This makes it possible to power the optical component via the second submount as well. However, a current input can also be made exclusively from the direction of the first submount.

Preferably, the second submount has a recess in one of its surfaces in which the optical component can be completely recessed. The surface of the second submount containing the recess and the surface of the optical component completely embedded in the recess facing outwards preferably form a common plane.

The idea of this invention is that a direct coupling between the optical component (e.g. laser) and the means for electronically driving (driving electronics) can be achieved by hybrid integration without parasitic inductive effects through the feed lines. This is made possible in particular by a direct integration of the optical component into the circuit of the driving electronics, whereby extremely low inductances can be achieved. This can be achieved in particular by a small spatial distance between the individual circuit elements, as large a width as possible of the feed lines within the means for electronic control with an adaptation of the width to the active length of the optical component as well as a small distance between the feed lines. The latter is achieved in particular by using wiring carriers (i.e. first submount), which consist of a particularly thin dielectric (e.g. a special, flexible printed circuit board material or LTCC (ceramic)). The total inductance typically achieved with an optical pulse generator according to the invention is approx. 100-200 pH.

By avoiding conventional bonding wires or contact ribbons, the inductances can be significantly reduced. Due to the low inductances, the generated radiation pulses can be switched off quickly in addition to being switched on quickly. In particular, this enables particularly high-frequency pulse width modulation in the optical range for imprinting an individual pulse width signature. The switching times of the pulses are preferably in the single-digit ns range, more preferably in the ps range.

Preferably, the system is constructed for measuring purposes by means of a pressure technique (clamping) or for practical use via a direct connection between at least one contact surface of means for electronically driving and at least one contact surface of the optical component. The optical component can preferably be clamped between the first submount and the second submount. Clamping can be carried out by means of a suitable fixing or holding device. Bonding or soldering can also be used as possible alternatives to direct clamping.

Preferably, the means for electronically driving is designed to imprint an individual signature on the radiation pulses emitted by the optical component via variable pulse width modulation. This individual signature can, for example, be a predefined scheme for pulse width modulation, a pulse sequence variation randomly defined for individual pulses or pulse sequences, or another modulation scheme suitable for unambiguous pulse assignment.

Preferably the electronic components of the means for electronically driving are arranged on a first side of the first submount, while the contact surfaces of the means for electronically driving are arranged on a second side of the first submount opposite the first side. Preferably, the electronic components and the contact surfaces are connected to each other to form a circuit. To connect the electronic components arranged on the first side of the first submount with the contact surfaces located on the opposite second side of the first submount, electrically conductive vias are preferably used in the first submount.

In a first embodiment of the present invention, a bipolar power supply of the optical component is provided onesidedly from the surface of the optical component facing the first submount. Power is therefore supplied exclusively via the first submount.

In a second version of the present invention, a bipolar power supply of the optical component can be provided both from the surface of the optical component facing the first submount (with a first polarity) and from the surface of the optical component facing the second submount (with a second polarity). In this case, the power is supplied via both the first and the second submount.

Another aspect of the present invention concerns a LiDAR system, which includes an optical pulse generator according to the invention. In particular, the high-frequency pulse width modulation made possible by the low inductance of the optical pulse generator allows the imprinting of an individual pulse signature for clear pulse identification. A corresponding bandwidth for pulse width modulation allows reliable measurements to be made even with a large number of independent LiDAR signals.

The present invention further comprises a method of operating an optical pulse generator comprising providing an active optical component, wherein the optical component has contact surfaces for electrical contacting; providing means for electronically driving the optical component, wherein the means for electronically driving has contact surfaces for electrical contacting; providing a first submount, wherein the means for electronically driving is arranged on the first submount; providing a second submount, wherein the optical component is arranged on the second submount; arranging the optical component between the first submount and the second submount, wherein at least one contact surface of the means for electronically driving is directly connected to at least one contact surface of the optical component; clamping the optical component between the first submount and the second submount; and exciting the optical component to pulsed emission of optical radiation via the means for electronically driving.

The method according to the invention is particularly suitable for testing individual optical components. An optical component excited for pulsed emission of optical radiation in accordance with the above method for operating an optical pulse generator can be tested non-destructively in short pulse operation by clamping (i.e. pressing the HF circuit directly onto the optical component) in accordance with the invention, whereby rapid replacement of the optical component is made possible without extensive bonding processes.

BRIEF DESCRIPTION OF THE DRAWINGS

The invention is explained in the following examples using the corresponding drawing. It is shown in.

DETAILED DESCRIPTION OF THE DRAWINGS

Figure 1:
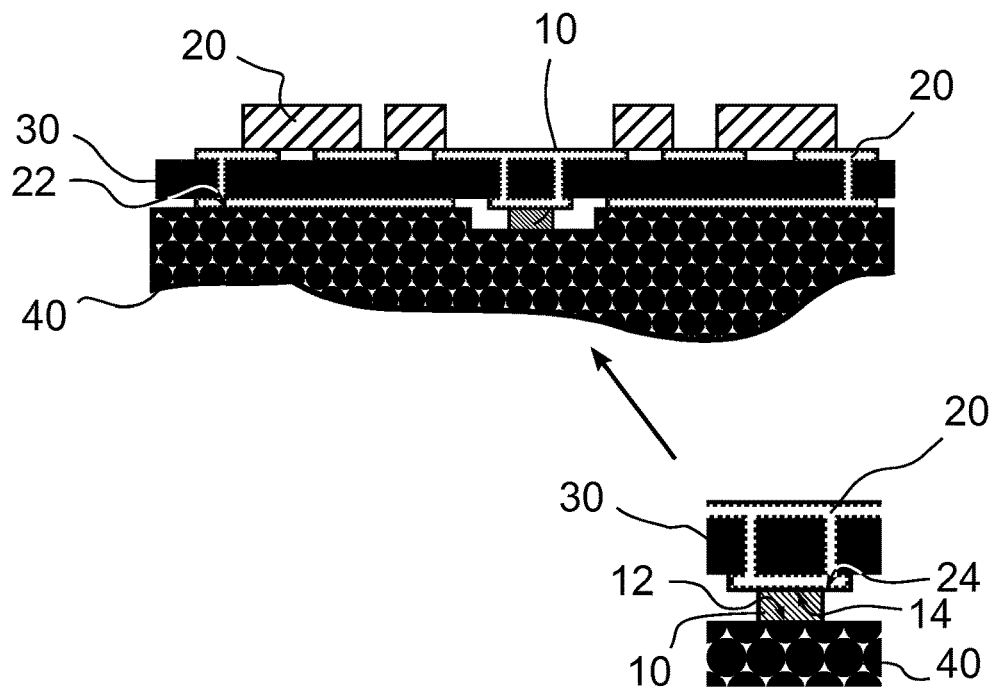
FIG. 1 a schematic representation of a first embodiment of an optical pulse generator according to the invention, and FIG. 2 a schematic representation of a second embodiment of an optical pulse generator according to the invention.

FIG. 1 shows a schematic representation of a first embodiment of an optical pulse generator according to the invention. The optical component 10 is completely recessed in a recess in the surface of the second submount 40, where in particular the surface of the second submount 40 directed in the direction of the first submount 30 forms a common plane with the surface of the optical component 10 also directed in the direction of the first submount 30. In such an arrangement, however, the surface of the optical component 10 directed towards the first submount 30 may also be oriented above or below the surface of the second submount 40 directed towards the first submount 30 in the direction of the optical component 10.

The first submount 30 serves as carrier for the means for electronically driving 20, which in the example shown is made up of various electronic components, conductor paths and at least two contact surfaces 22, 24 designed for contacting. Preferably, as also shown in FIG. 1, the electronic components are arranged on a side of the first submount 30 opposite the contact surfaces 22, 24 (i.e. on the upper side of the first submount 30), wherein electrically conductive connections between the conductor tracks connecting the electronic components to form a circuit are guided on the upper side of the first submount 30 and the contact surfaces 12, 14 located on the underside of the submount 30 are guided through the first submount 30 (vias).

The means for electronically driving 20 is designed to couple high current pulses for electronic excitation of the optical component 10 into the optical component from both sides in relation to the centre position of the optical component 10, i.e. the high current pulses are generated both by the arranged electronic components to the left of the optical component 10 and by the arranged electronic components to the right of the optical component 10.

The optical component 10 is preferably clamped between the first submount 30 and the second submount 40, whereby at least one contact surface 14 of the optical component 10 contacts at least one contact surface 24 of the means for electronically driving 20. The contacting can be done by touching the contact surfaces 14, 24 alone or by means of a soldering point between the contact surfaces 14, 24. In addition, any contact agent acting as an electrically conductive contact mediator can be used to improve contacting (e.g. graphite-containing electrically conductive paste with corrosion protection).

In the embodiment shown, the means for electronically driving 20 has at least one further contact surface 22 which has no direct contact with at least one contact surface 12 of the optical component 10. Preferably, the second submount 40 comprises an electrically conductive material (e.g. a metal) adapted to permit current flow between the contact surface 12 of the optical component 10 and the contact surface 22 of the means for electronically driving 20 via the second submount 40. The entire second submount 40 preferably consists of a thermally and electrically conductive material (e.g. silver, copper, gold, aluminium). In the example shown, the optical component 10 is powered from opposite sides of the optical component 10.

Figure 2:
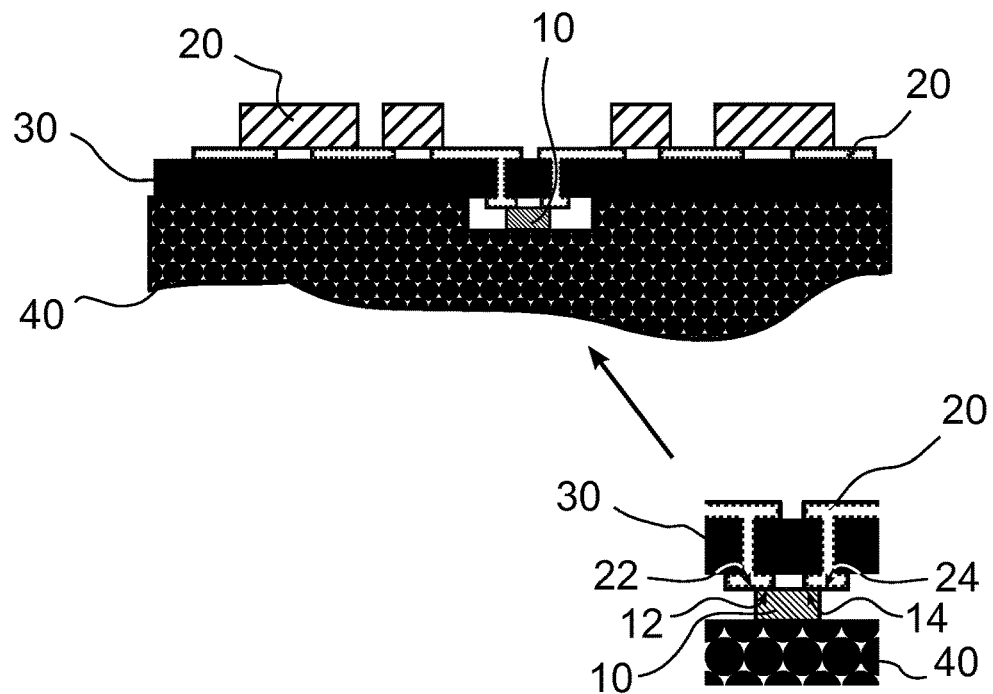

FIG. 2 shows a schematic representation of a second embodiment of an optical pulse generator according to the invention. The basic structure corresponds as far as possible to the design shown in FIG. 1. The respective reference signs and their assignment apply accordingly. In contrast to FIG. 1, power is supplied to optical component 10 exclusively from one side of optical component 10. The surface of the optical component 10 directed in the direction of the first submount 30 is aligned below the surface of the second submount 40 directed in the direction of the first submount 30, so that the contact surfaces 22, 24, which are independent of one another, of the means for electronically driving 20 arranged on the underside of the first submount lie flat on the surface of the underlying optical component 10, i.e. on the contact surfaces 12, 14 of the optical component 10 located there.

REFERENCE LIST

10 Optical component
12 Contact surface (optical component 10)
14 Contact surface (optical component 10)
20 Means for electronically driving
22 Contact surface (means for electronically driving 20)
24 Contact surface (means for electronically driving 20)
30 First submount
40 Second submount

The invention claimed is:

1. An optical pulse generator comprising:
   an active optical component adapted to emit optical radiation, wherein the optical component has contact surfaces for electrical contacting;
   means for electronically driving the optical component adapted to excite the optical component to a pulsed emission of optical radiation, wherein the means for electronically driving comprises contact surfaces for electrical contacting as well as electronic components, and at least one contact surface of the means for electronically driving is connected directly or by means of a solder point to at least one contact surface of the optical component;
   a first submount, wherein the means for electronically driving is arranged on the first submount, wherein the electronic components are arranged on a first side of the first submount, the contact surfaces of the means for electronically driving are arranged on an opposite second side of the first submount, and the electronic components are connected to the contact surfaces of the means for electronically driving using electrically conductive vias in the first submount; and
   a second submount, wherein the optical component is arranged on the second submount, wherein the optical component is arranged between the first submount and the second submount.

2. The optical pulse generator of claim 1, wherein the optical component is completely recessed in a recess in the surface of the second submount.

3. The optical pulse generator of claim 1, wherein the contact surfaces of the means for electronically driving are made of a metal.

4. The optical pulse generator of claim 1, wherein the optical component is clamped between the first submount and the second submount.

5. The optical pulse generator of claim 1, wherein the first submount is a flexible circuit board and the means for electronically driving is a high frequency circuit for electronically exciting the optical component to a pulsed emission of optical radiation.

6. The optical pulse generator of claim 1, wherein the means for electronically driving is adapted to apply an individual signature to the radiation pulses emitted by the optical component via variable pulse width modulation.

7. A LiDAR system comprising an optical pulse generator adapted to imprint an individual pulse signature to the optical pulses used as LiDAR pulses comprising:
   an active optical component adapted to emit optical radiation, wherein the optical component has contact surfaces for electrical contacting;

means for electronically driving the optical component adapted to excite the optical component to a pulsed emission of optical radiation, wherein the means for electronically driving comprises contact surfaces for electrical contacting as well as electronic components, wherein at least one contact surface of the means for electronically driving is connected directly or by means of a solder point to at least one contact surface of the optical component;

a first submount, wherein the means for electronically driving is arranged on the first submount, wherein the electronic components are arranged on a first side of the first submount, the contact surfaces of the means for electronically driving are arranged on an opposite second side of the first submount, and the electronic components are connected to the contact surfaces of the means for electronically driving using electrically conductive vias in the first submount;

a second submount, wherein the optical component is arranged on the second submount, wherein the optical component is arranged between the first submount and the second submount.

8. A method of operating an optical pulse generator comprising:

providing an active optical component, wherein the optical component has contact surfaces for electrical contacting;

providing a means for electronically driving the optical component, wherein the means for electronically driving has contact surfaces for electrical contacting as well as electronic components;

providing a first submount, wherein the means for electronically driving is arranged on the first submount, wherein the electronic components are arranged on a first side of the first submount, the contact surfaces of the means for electronically driving are arranged on an opposite second side of the first submount, and the electronic components are connected to the contact surfaces of the means for electronically driving using electrically conductive vias in the first submount;

providing a second submount, wherein the optical component is arranged on the second submount;

arranging the optical component between the first submount and the second submount, wherein at least one contact surface of the means for electronically driving is connected directly or by means of a solder point to the contact surfaces of the optical component;

clamping the optical component between the first submount and the second submount;

exciting the optical component to a pulsed emission of optical radiation via the means for electronically driving.

* * * * *